United States Patent
Arsovski et al.

(10) Patent No.: US 8,839,159 B2
(45) Date of Patent: Sep. 16, 2014

(54) DETERMINING OVERALL OPTIMAL YIELD POINT FOR A SEMICONDUCTOR WAFER

(71) Applicant: International Business Machine Corporation, Armonk, NY (US)

(72) Inventors: Igor Arsovski, Williston, VT (US); Aurelius L. Graninger, Essex Junction, VT (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 13/743,810

(22) Filed: Jan. 17, 2013

(65) Prior Publication Data

US 2014/0201697 A1    Jul. 17, 2014

(51) Int. Cl.
    *G06F 17/50*      (2006.01)

(52) U.S. Cl.
    USPC ................................ 716/54; 716/56; 716/132

(58) Field of Classification Search
    USPC ......................................... 716/51, 54, 46, 132
    See application file for complete search history.

(56) References Cited

U.S. PATENT DOCUMENTS

| | | | |
|---|---|---|---|
| 6,934,671 B2 | 8/2005 | Bertsch et al. | |
| 7,010,382 B2 | 3/2006 | Cheng et al. | |
| 7,099,729 B2 | 8/2006 | Tai et al. | |
| 7,260,444 B2 | 8/2007 | Chen et al. | |
| 7,620,921 B2 | 11/2009 | Foreman et al. | |
| 7,656,182 B2 | 2/2010 | Bickford et al. | |
| 7,803,644 B2 | 9/2010 | Balch et al. | |
| 7,962,234 B2 | 6/2011 | Song et al. | |
| 7,966,087 B2 | 6/2011 | Kokotov et al. | |
| 8,097,474 B2 | 1/2012 | Anemikos et al. | |
| 2006/0111869 A1* | 5/2006 | Shen et al. | ..................... 702/179 |
| 2009/0070722 A1 | 3/2009 | Bickford et al. | |
| 2009/0212794 A1 | 8/2009 | Chang et al. | |
| 2012/0074980 A1 | 3/2012 | Choi et al. | |

* cited by examiner

*Primary Examiner* — Paul Dinh
(74) *Attorney, Agent, or Firm* — Jinesh P. Patel

(57) ABSTRACT

A computer determines a component optimal yield point for each component of the plurality of components, where the component optimal yield point represents the process parameter values where maximum yield is achieved for a component. The computer determines a weight factor for each component of the plurality of components, where the weight factor represents an importance of a component to the semiconductor device. The computer then determines an overall optimal yield point based on the component yield point and weight factor determined for each component of the plurality of components, the overall optimal yield point representing the process parameter values where maximum yield is achieved for the semiconductor device.

9 Claims, 7 Drawing Sheets

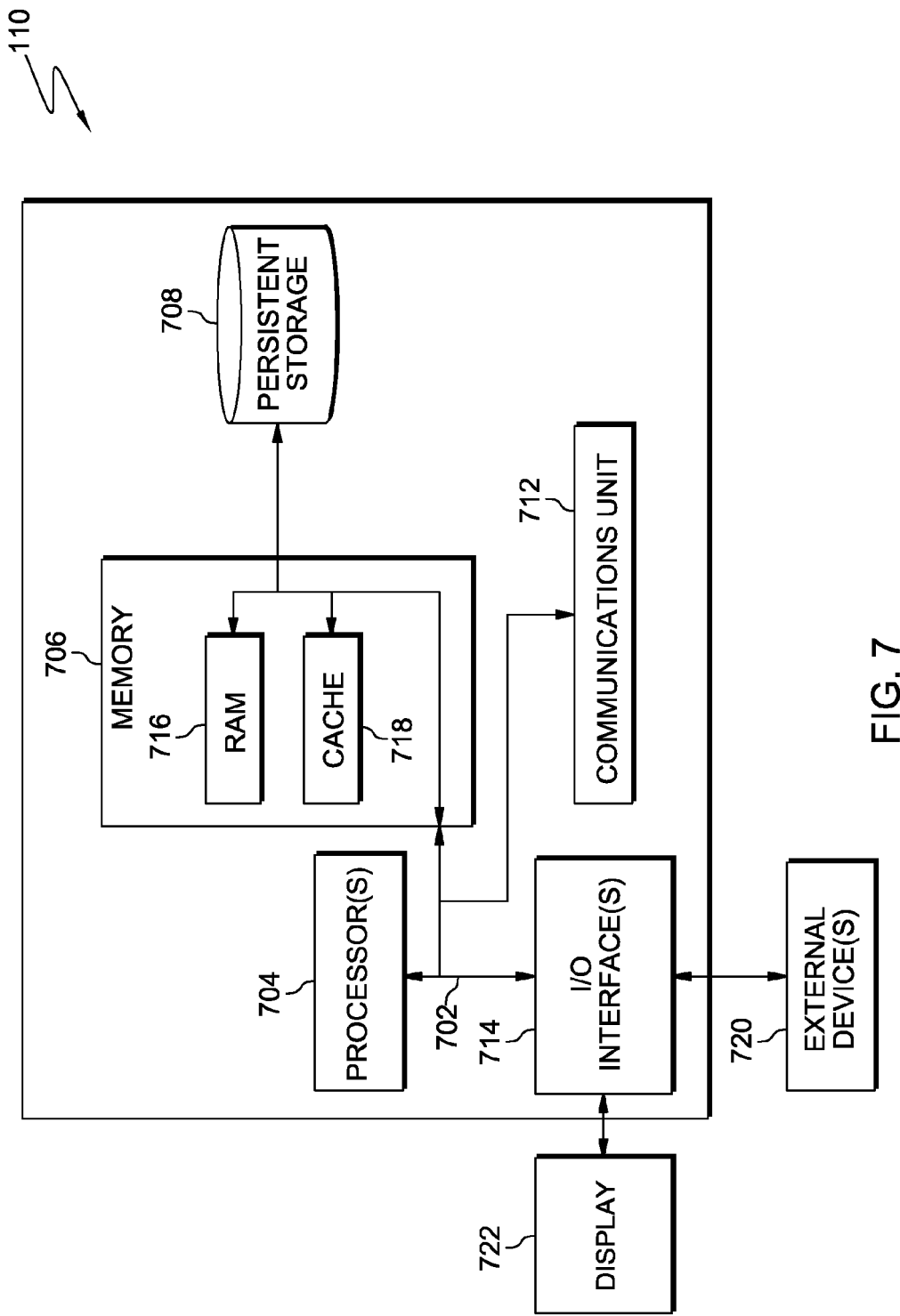

DETERMINING OVERALL OPTIMAL YIELD POINT FOR A SEMICONDUCTOR WAFER

FIELD OF THE INVENTION

The present invention relates generally to semiconductor fabrication, and more particularly to determining an overall optimal yield point where maximum yield is achieved for a semiconductor wafer.

BACKGROUND

An application-specific integrated circuit (ASIC) is an integrated circuit customized for a particular use, rather than general purpose use. For example, a chip designed to run specifically in a digital voice recorder is an ASIC. As feature sizes have continued to shrink and design tools have continued to improve, the maximum complexity, and hence functionality, possible in an ASIC has grown from 5,000 gates to over 100 million gates.

Due to their complex nature, ASICs often contain several different components such as microprocessors, random-access memory (RAM), read-only memory (ROM), electrically erasable programmable read-only memory (EEPROM), and Flash memory. Each of these components have different yield sensitivities and therefore may produce a higher or lower yield dependent on the different process parameters implemented during the manufacturing process. If the line does not take yield sensitivities into account, the resulting ASIC may yield at an insufficient level. In addition, in low volume manufacturing, re-tuning the line after yield sensitivities have been characterized on an ASIC can be very costly.

SUMMARY

Embodiments of the present invention provide a system, computer program product and method for determining an overall optimal yield point for a semiconductor device, the semiconductor device comprising a plurality of components. A computer determines a component optimal yield point for each component of the plurality of components, where the component optimal yield point represents the process parameter values where maximum yield is achieved for a component. The computer determines a weight factor for each component of the plurality of components, where the weight factor represents an importance of a component to the semiconductor device. The computer then determines an overall optimal yield point based on the component yield point and weight factor determined for each component of the plurality of components, the overall optimal yield point representing the process parameter values where maximum yield is achieved for the semiconductor device.

BRIEF DESCRIPTION OF THE SEVERAL VIEWS OF THE DRAWINGS

FIG. 7 is a block diagram depicting the hardware components of the optimal yield determination system of FIG. 1, in accordance with an embodiment of the invention.

DETAILED DESCRIPTION

Figure 1:
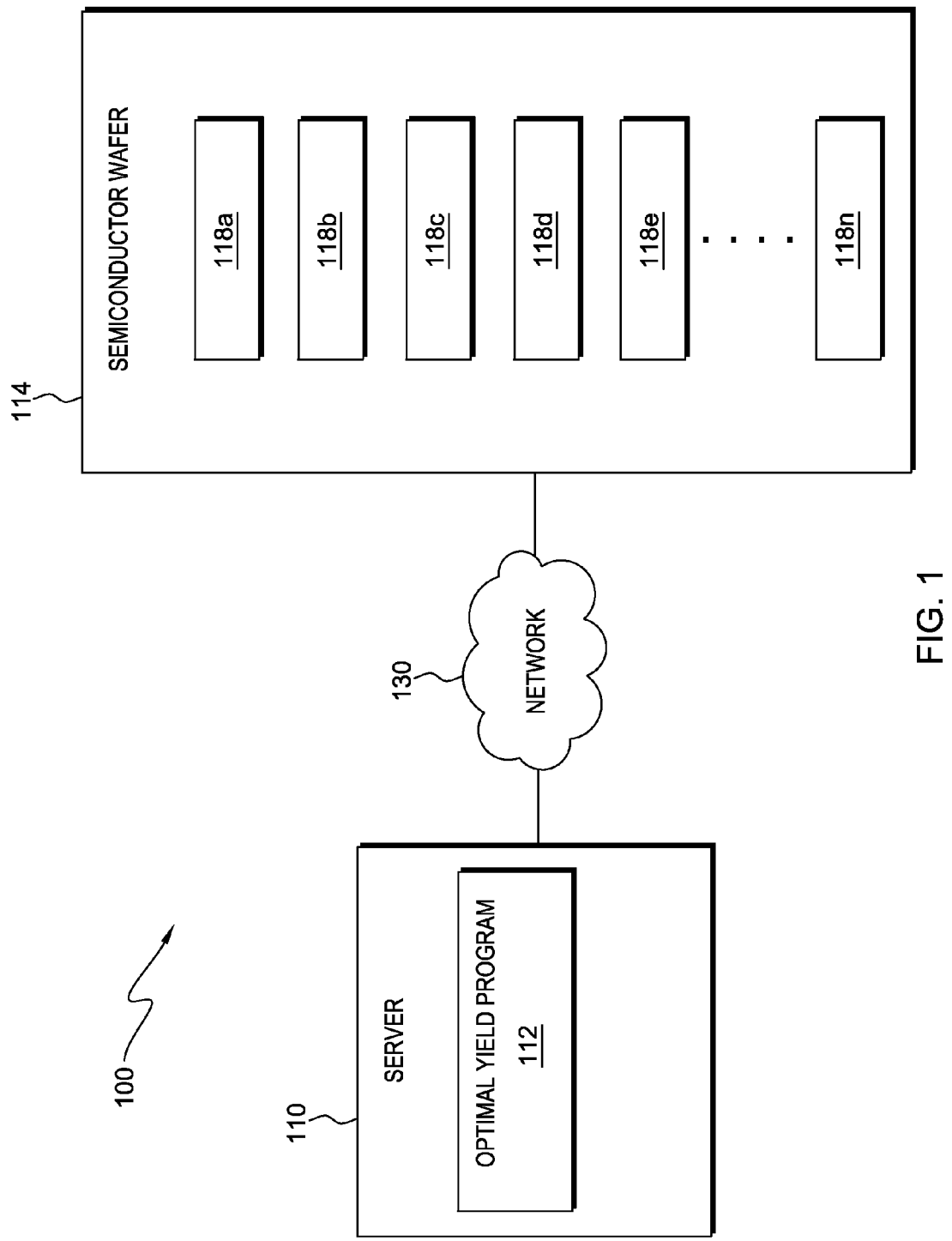
FIG. 1 depicts an optimal yield determination system, in accordance with an embodiment of the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code/instructions embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM), an electrically erasable programmable read-only memory (EEPROM), Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Embodiments of the present invention will now be described in detail with reference to the accompanying Figures.

FIG. 1 illustrates optimal yield determination system 100, in accordance with an embodiment of the invention. Optimal yield determination system 100 includes server 110 and semiconductor wafer 114, interconnected over network 130.

In an exemplary embodiment, network 130 is the Internet, representing a worldwide collection of networks and gateways to support communications between devices connected to the Internet. In the exemplary embodiment, network 130 is also a collection of networks and gateways capable of communicating global positioning information between devices connected to the network. Network 130 may include, for example, wired, wireless or fiber optic connections. In other embodiments, network 130 may be implemented as an intranet, a local area network (LAN), or a wide area network (WAN). In general, network 130 can be any combination of connections and protocols that will support communications between server 110 and semiconductor wafer 114, in accordance with embodiments of the invention. In other embodiments, server 110 may be directly connected or wired to semiconductor wafer 114.

Semiconductor wafer 114 includes semiconductor device systems 118a through 118n. In the exemplary embodiment, semiconductor wafer 114 is a hardware device that includes a plurality of substantially identical semiconductor device systems. The components of semiconductor wafer 114 are described in further detail with regard to FIG. 2.

Server 110 includes optimal yield program 112. Server 110 may be a desktop computer, a notebook, a laptop computer, a tablet computer, a handheld device, a smart-phone, a thin client, or any other electronic device or computing system capable of receiving and sending data to and from semiconductor wafer 114 directly or via network 130. The components of server 110 are described in more detail with reference to FIG. 7.

Optimal yield program 112 includes components to analyze the yield of each semiconductor device systems 118 and determine an overall optimal yield point for semiconductor wafer 114. The operations of optimal yield program 112 are described in further detail below with reference to FIGS. 2 through 6.

Figure 2:
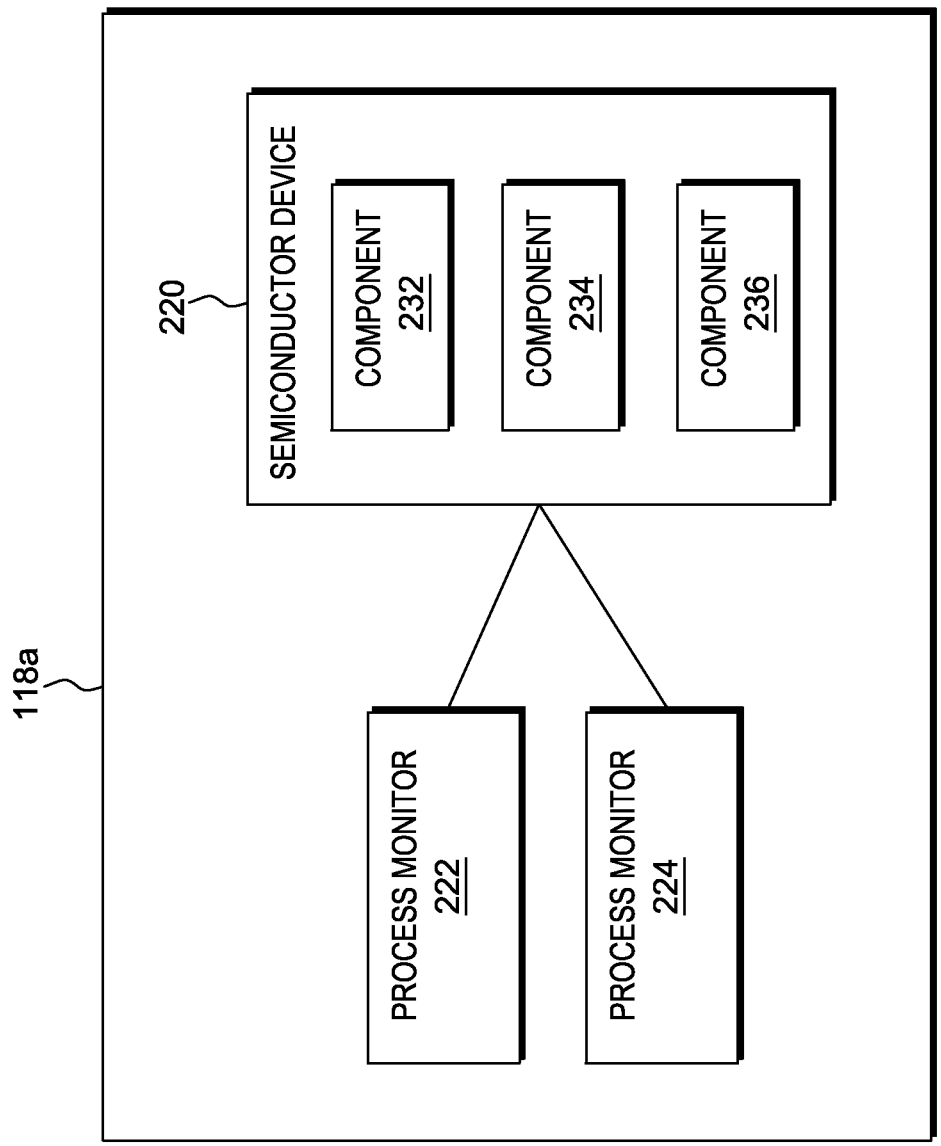
FIG. 2 depicts a semiconductor device system located on a semiconductor wafer, in accordance with an embodiment of the invention.

FIG. 2 depicts semiconductor device system 118a located on a semiconductor wafer, in accordance with an embodiment of the invention. Semiconductor device system 118a includes semiconductor device 220 which is directly connected with process monitor 222 and process monitor 224.

In the exemplary embodiment, semiconductor device 220 is a hardware device that includes component 232, component 234, and component 236. As stated above, in the exemplary embodiment, semiconductor device systems 118a through 118n are substantially identical. This is a result of each of semiconductor device systems 118 containing a substantially identical semiconductor device. The semiconductor devices contained in semiconductor device systems 118 are substantially identical and not identical because slight statistical variations and randomness during the fabrication process can result in the components in common between the semiconductor devices having slightly different process parameter ranges, such as threshold voltage ranges of the transistors which comprise each semiconductor device. For example, for two substantially identical semiconductor devices, a first component of semiconductor device 1 may be characterized by a transistor threshold voltage of 250 mV while the first component of semiconductor device 2 may be characterized by a threshold voltage of 260 mV.

In the exemplary embodiment, components 232, 234, and 236 are hardware devices such as random-access memory blocks (RAM) or microprocessors. Although only three components are depicted in this Figure, in other embodiments, a plurality of components may be present in each semiconductor device system of semiconductor wafer 114.

In the exemplary embodiment, process monitor 222 and process monitor 224 are hardware devices each capable of measuring a specific process parameter, such as the threshold voltage of a transistor which comprises the components of semiconductor device 220. The process monitors are located either in the scribe line adjacent to the semiconductor device, or within the semiconductor device itself, and due to the close proximity of the process monitors to the semiconductor device components, the process parameter values measured in the process monitors are used to characterize the process parameter values of the transistors and other discrete elements comprising the semiconductor device components. In the exemplary embodiment, process monitor 222 measures the threshold voltage of semiconductor device 220 and process monitor 224 measures the length of the poly-silicon gate (LPOLY) of semiconductor device 220. In other embodiments, process monitors 222 and 224 may measure a variety of other process parameters. In the exemplary embodiment, identical process monitors are present in each semiconductor device systems 118. In addition, although only two process monitors are depicted in this Figure, in other embodiments, a plurality of process monitors may be present in each semiconductor device system of semiconductor wafer 114.

Figure 3:
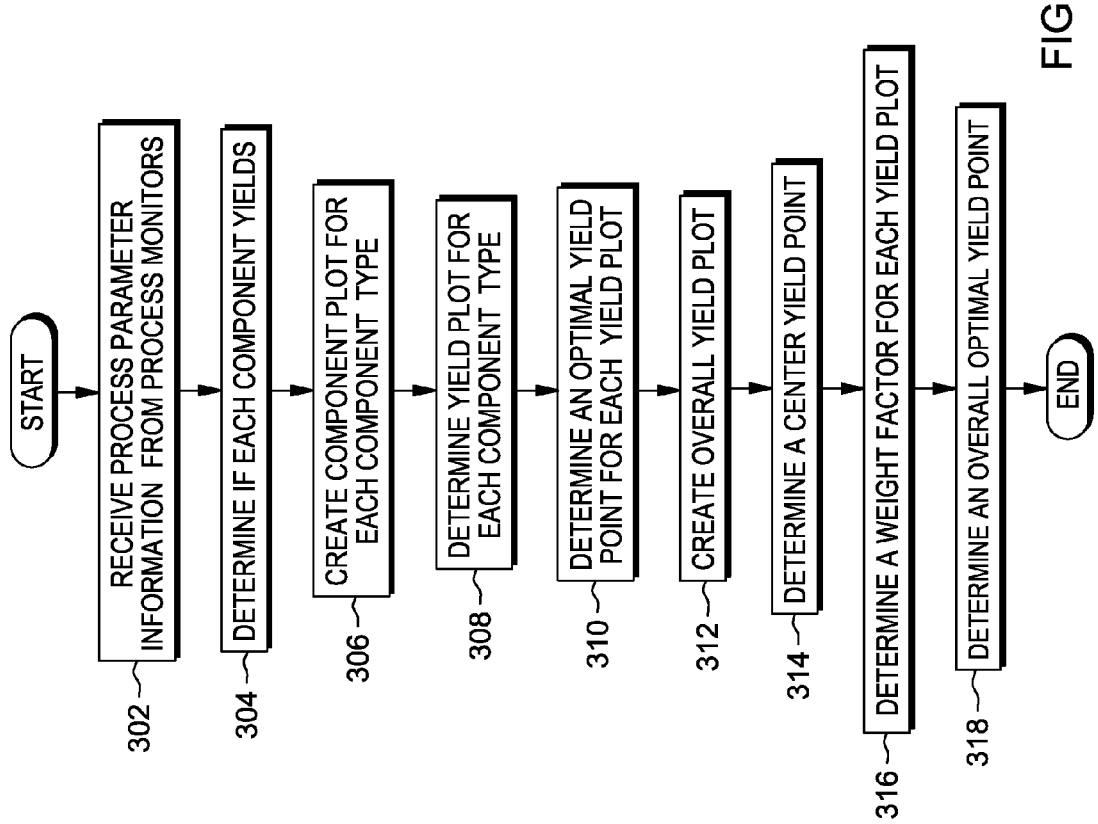
FIG. 3 is a flowchart that illustrates a process for determining an overall optimal yield point for the semiconductor wafer, in accordance with an embodiment of the invention.

FIG. 3 is a flowchart illustrating the operations of optimal yield program 112 in determining the optimal yield point for semiconductor wafer 114, in accordance with an exemplary embodiment of the invention. In an exemplary embodiment, optimal yield program 112 receives process parameter information for each semiconductor device in semiconductor wafer 114 from the relevant process monitors (step 302). For example, with regard to semiconductor device system 118a, optimal yield program 112 receives the threshold voltage of semiconductor device 220 from process monitor 222 and receives the LPOLY of semiconductor device 220 from process monitor 224.

Optimal yield program 112 then determines if each component of each semiconductor device contained in semiconductor wafer 114 yields or does not yield (step 304). With regard to semiconductor device system 118a, a specific component of semiconductor device 220, such as component 232, may yield or may not yield dependent on the process parameter values present, such as the threshold voltage value, on semiconductor device 220. For example, component 232 may represent a memory block, which may only yield optimally if the threshold voltage of semiconductor device 220 falls within the range of 300 mV to 350 mV. If the threshold voltage of semiconductor device 220 does not fall within this range, component 232 may not yield. In the exemplary embodiment, the term yield refers to whether the component functions as intended, such as whether a cell of memory successfully stores values, i.e., 1s and 0s, into memory.

Optimal yield program 112 then creates a component plot for each component type of semiconductor wafer 114 (step 306). In the exemplary embodiment, the component plot is two dimensional with the x-axis representing LPOLY and the y-axis representing the threshold voltage. In other embodiments, the yield plot can be multi-dimensional with one axis for each process monitor, i.e., one axis for each process parameter. As stated above, each semiconductor device contained in semiconductor wafer 114 is substantially identical and, therefore, each semiconductor device contains identical components. For instance, the semiconductor device of semiconductor device system 118b contains one component identical to component 232, one component identical to component 234, and one component identical to component 236. In the exemplary embodiment, a component plot is created for each type of component, and therefore, optimal yield program 112 creates three component plots. Thus, if component 232 is a DRAM memory block, optimal yield program 112 plots one point on the component plot for each DRAM memory block contained in semiconductor wafer 114, with the placement of the point depending on the threshold voltage and LPOLY measurements received from the relevant process monitor. In the exemplary embodiment, when plotting on the component plot, optimal yield program 112 also distinguishes whether each component yields or does not yield. For example, with regard to component 232 in semiconductor device system 118a, if optimal yield program 112 receives a threshold voltage of 300 mV from process monitor 222 and a LPOLY of 32 nm from process monitor 224, optimal yield program 112 plots a point at (32, 300) on the component plot. If optimal yield program 112 determines that component 232 yields, the point is plotted in a manner to indicate a yielding point, such as plotting the point in red. If optimal yield program 112 determines that component 232 does not yield, the point is plotted in a manner to indicate a non-yielding point, such as plotting the point in black.

Optimal yield program 112 then determines a yield plot from the component plot for each component type (step 308). In the exemplary embodiment, the component plot is first analyzed and plotted as a component contour plot comprising of closed equiyield lines which define ranges of process parameter values of equal yield percentages; as the radial distance from the center-point of the plot is increased, the yield percentage decreases. The number of equal yield regions and thus the resolution of the contour plot is left to the discretion of the semiconductor manufacturer and then calculated by the optimal yield program 112. The yield plot is then taken to be the optimally yielding region on the contour plot, the percentage of which has been predefined. In the exemplary embodiment, the yield plot represents an area within a component plot where at least ninety percent of points plotted by optimal yield program 112 are yield points. The choice of percentage for determining the yield plot is not restricted to any one value, and in general, as the percentage for the yield plot is decreased, the range of process parameter values grows, and as the percentage for the yield plot is increased, the range of process parameter values shrinks.

Optimal yield program 112 then determines an optimal yield point for each yield plot (step 310). In the exemplary embodiment, optimal yield program 112 determines the optimal yield point of a yield plot by determining the center point of the yield plot.

Optimal yield program 112 then combines the individual yield plots together to form an overall yield plot (step 312). In the exemplary embodiment, optimal yield program 112 combines the three yield plots created, one for each type of component, into an overall yield plot.

Optimal yield program 112 then determines a center yield point of the overall yield plot (step 314). In the exemplary embodiment, optimal yield program 112 determines the center yield point by determining the center point between the optimal yield points determined for each individual yield plot. For example, with regard to semiconductor wafer 114, optimal yield program 114 creates three yield plots, one for each type of component. Optimal yield program 114 connects the optimal yield points of each yield plot to form a triangle. Optimal yield program 114 then determines the center yield point by calculating the center of the triangle.

Optimal yield program 112 then determines a weight factor for each yield plot (step 316). In the exemplary embodiment, the weight factor of a yield plot is determined by the importance of the component type to the semiconductor device and the number of the component type present on each semiconductor device. For example, if there are two DRAM components and one microprocessor component present on each semiconductor device, optimal yield program 112 assigns a weight factor to the yield plot representing the DRAM component. However, the microprocessor component will also be assigned a weight factor by optimal yield program 112 commensurate with its importance to the semiconductor device despite the higher number of DRAM components. The precise values of the weight factors are dependent on the preferences of the semiconductor manufacturer.

Optimal yield program 112 then determines an overall optimal yield point for semiconductor wafer 114 by adjusting the center yield point based on the weight factors of each yield plot (step 318). For example, with regard to the example above, if the DRAM yield plot is assigned a weight factor that is higher than the other yield plots, optimal yield program 112 adjusts the center yield point towards the optimal yield point of the DRAM yield plot. Note that the center yield point is equivalent to an overall optimal yield point in the case of all components having equal weight factors. This process is discussed in further detail with regard to FIGS. 4 through 6.

Figure 4:
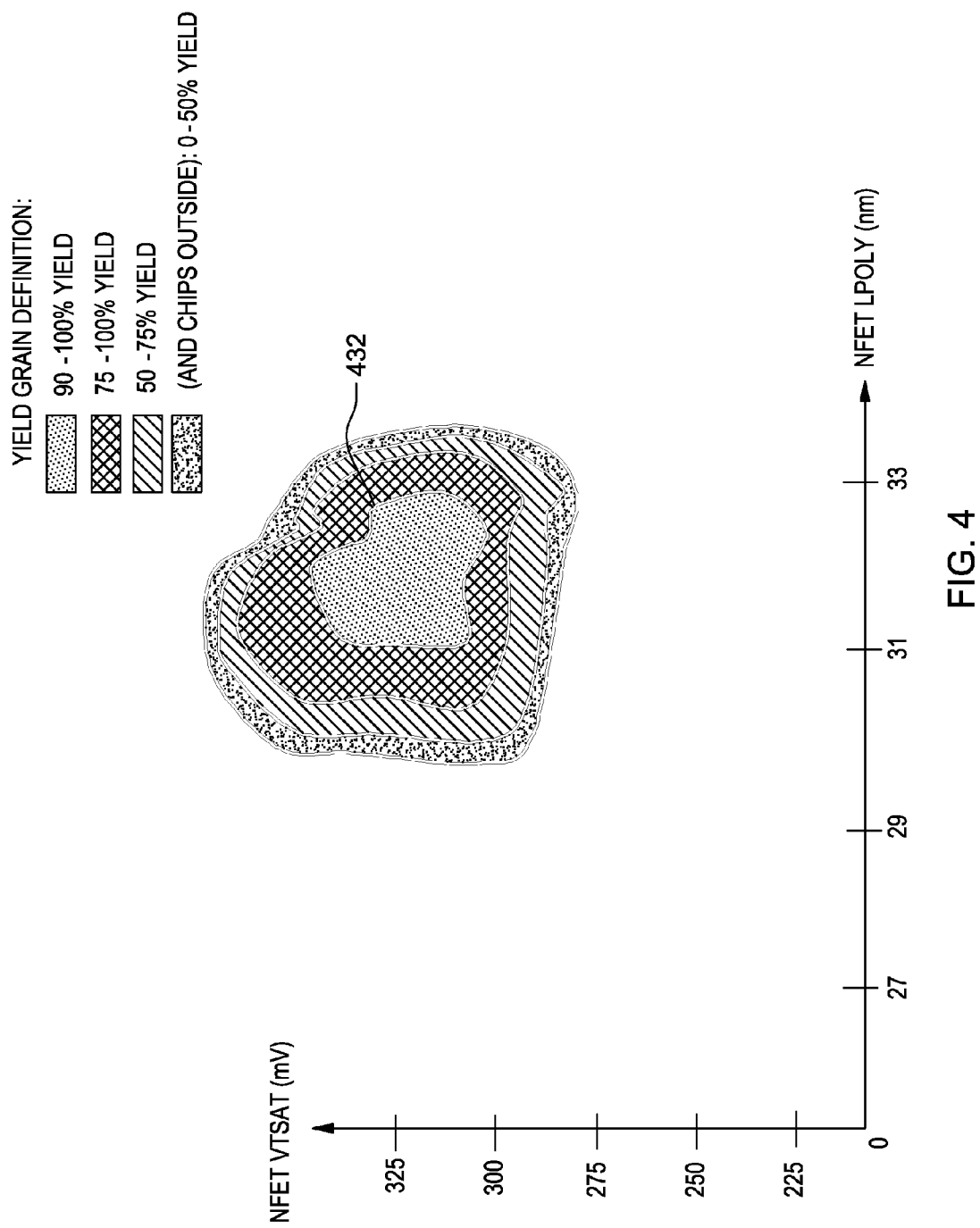
FIG. 4 depicts a component plot for a component type of the semiconductor wafer, in accordance with an embodiment of the invention.

FIG. 4 depicts a component plot for a component type of the semiconductor wafer, in accordance with an embodiment of the invention. As stated above, optimal yield program 112 creates a component plot for each component type (step 306). FIG. 4 depicts a component plot for a component type, with the component plot divided into areas, each area representing a process parameter range where a certain yield percentage exists for the component type. The yield percentage of an area represents the percentage of plotted points in the area that are yield points. For example, yield plot 432 is the where the yield percentage is at least ninety percent. In other words, yield plot 432 is the yield plot for the component type.

Figure 5:
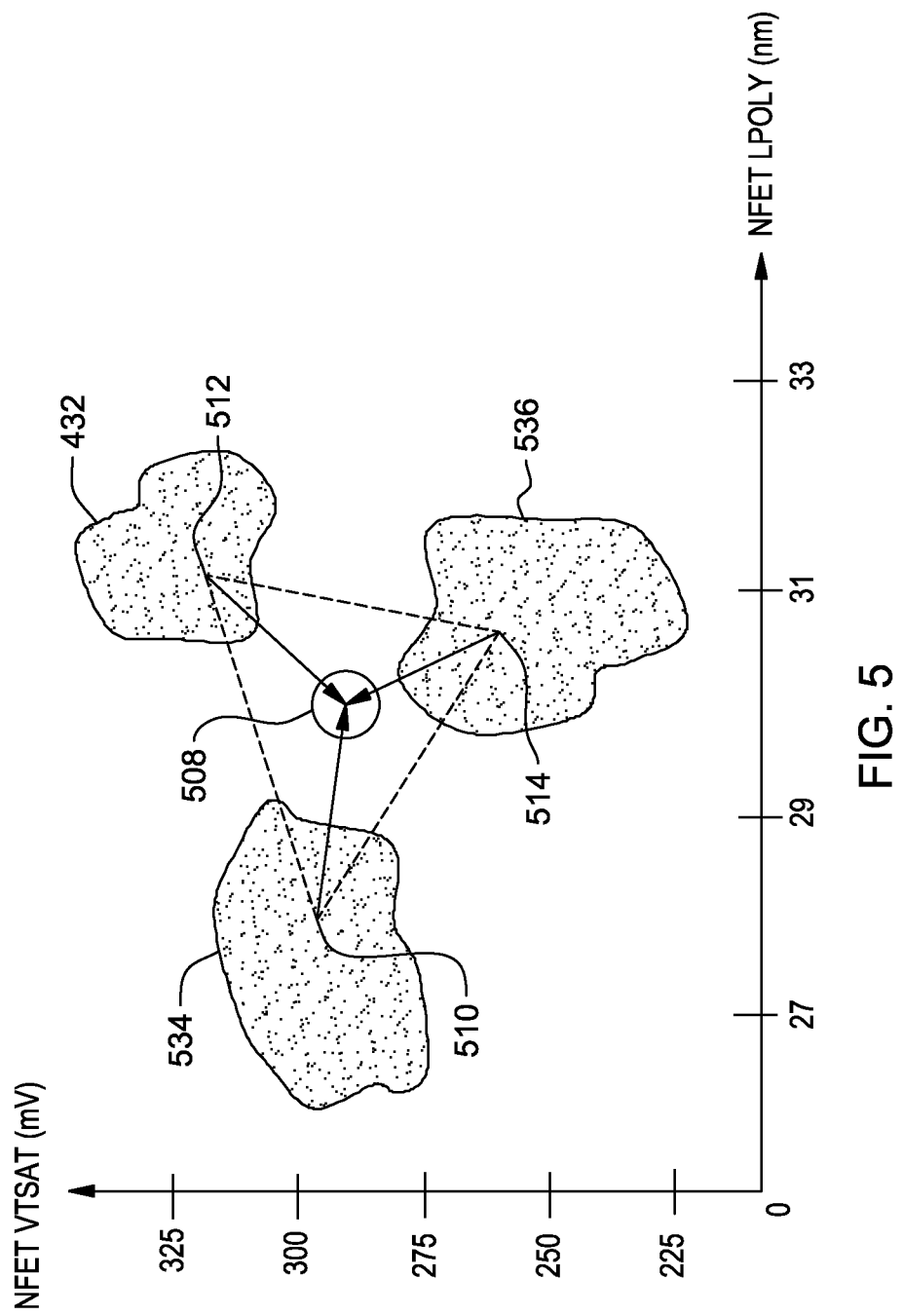
FIG. 5 depicts the determination of a center yield point for the semiconductor wafer, in accordance with an embodiment of the invention.

FIG. 5 depicts the determination of the center yield point of the overall yield plot of semiconductor wafer 114, in accordance with an embodiment of the invention. As stated above, optimal yield program 112 determines a yield plot for each component type (step 308). Yield plot 432 represents the yield plot for component 232, yield plot 534 represents the yield plot for component 234, and yield plot 536 represents the yield plot for component 236. Optimal yield program 112 then determines an optimal yield point for each yield plot (step 310). Optimal yield point 510 represents the optimal yield point for yield plot 534, optimal yield point 512 represents the optimal yield point for yield plot 432, and optimal yield point 514 represents the optimal yield point for yield plot 536. Optimal yield program 112 then determines the center yield point (step 314), represented by center yield point 508. FIG. 5 depicts this determination by connecting optimal yield points 510, 512, and 514 to form a triangle and then subsequently determining the center point of the triangle. In other embodiments, the center point between the optimal yield points may be determined by way of a variety of other mathematical algorithms.

Figure 6:
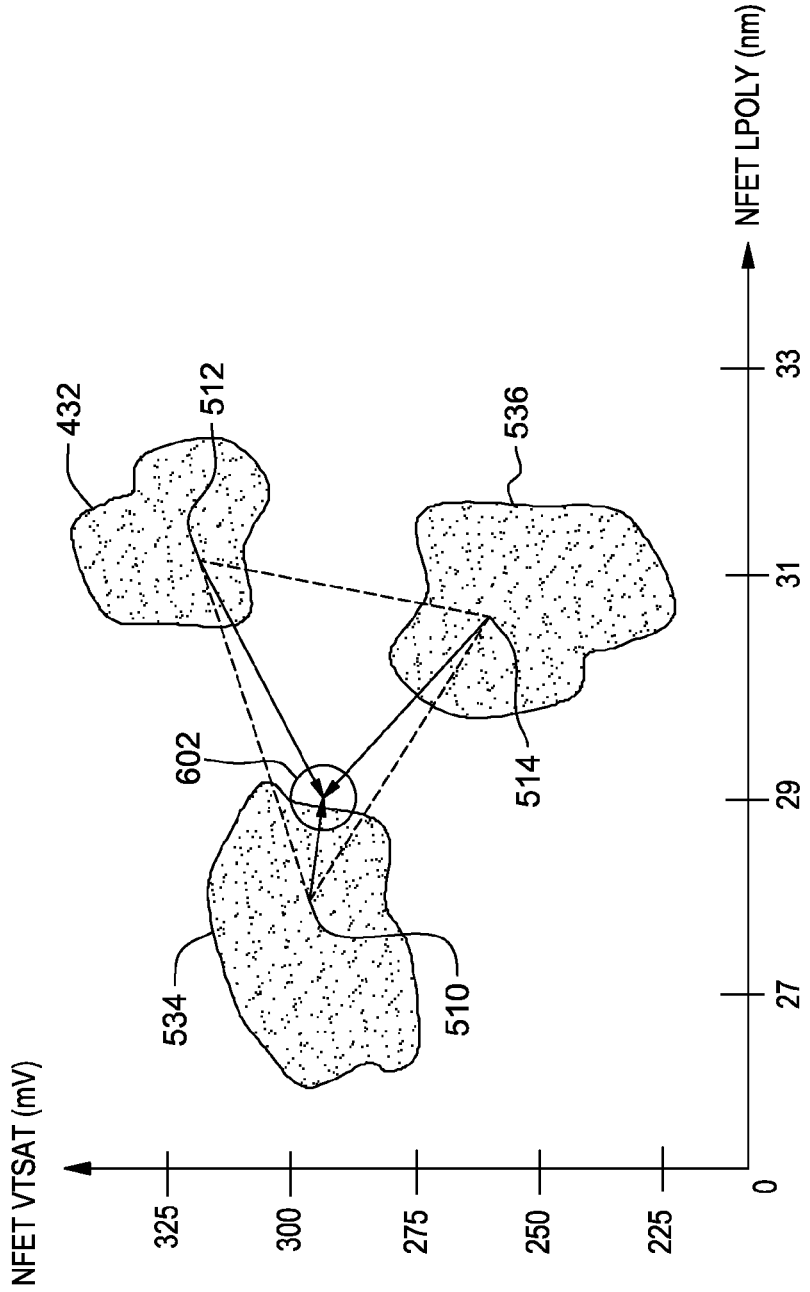
FIG. 6 depicts the determination of the overall optimal yield point for the semiconductor wafer, in accordance with an embodiment of the invention.

FIG. 6 depicts the determination of the overall optimal yield point for semiconductor wafer 114, in accordance with an embodiment of the invention. As stated above, once the center yield point is determined, optimal yield program 112 determines an overall optimal yield point for semiconductor wafer 114 by adjusting the center yield point based on the weight factors of each yield plot (step 318). FIG. 6 depicts an exemplary embodiment where optimal yield program 112 determines that yield plot 432 has a weight factor of 0.5, yield plot 534 has a weight factor of 2, and yield plot 536 has a weight factor of 0.5. Therefore, in the exemplary embodiment, since yield plot 534 has the highest weight factor, optimal yield program 112 adjusts center yield point 508 towards optimal yield point 510 resulting in overall optimal yield point 602. In the exemplary embodiment, since the weight factor of yield plot 534 is four times that of yield plot 432 or 536, optimal yield program 112 adjusts the center yield point so the resulting overall optimal yield point 602 is four times closer to optimal yield point 510 then it is to optimal yield point 512 or optimal yield point 514. This is depicted in FIG. 6, as the length of the vector stretching from optimal yield point 510 to overall optimal yield point 602 is one fourth the length of either of the vectors stretching from optimal yield points 514 and 512 to overall optimal yield point 602.

The foregoing description of various embodiments of the present invention has been presented for purposes of illustration and description. It is not intended to be exhaustive nor to limit the invention to the precise form disclosed. Many modifications and variations are possible. Such modifications and variations that may be apparent to a person skilled in the art of the invention are intended to be included within the scope of the invention as defined by the accompanying claims.

FIG. 7 depicts a block diagram of components of server 110, in accordance with an illustrative embodiment of the present invention. It should be appreciated that FIG. 7 provides only an illustration of one implementation and does not imply any limitations with regard to the environments in which different embodiments may be implemented. Many modifications to the depicted environment may be made.

Server 110 includes communications fabric 702, which provides communications between computer processor(s) 704, memory 706, persistent storage 708, communications unit 712, and input/output (I/O) interface(s) 714. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses.

Memory 706 and persistent storage 708 are computer-readable storage media. In this embodiment, memory 706 includes random access memory (RAM) 716 and cache memory 718. In general, memory 706 can include any suitable volatile or non-volatile computer-readable storage media.

The optimal yield program 112 in server 110 are stored in persistent storage 708 for execution by one or more of the respective computer processors 704 via one or more memories of memory 706. In this embodiment, persistent storage 708 includes a magnetic hard disk drive. Alternatively, or in addition to a magnetic hard disk drive, persistent storage 708 can include a solid state hard drive, a semiconductor storage device, read-only memory (ROM), erasable programmable read-only memory (EPROM), electrically erasable programmable read-only memory (EEPROM), Flash memory, or any other computer-readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer-readable storage medium that is also part of persistent storage 708.

Communications unit 712, in these examples, provides for communications with other data processing systems or devices. In these examples, communications unit 712 includes one or more network interface cards. Communications unit 712 may provide communications through the use of either or both physical and wireless communications links. The optimal yield program 112 in server 110 may be downloaded to persistent storage 708 through communications unit 712.

I/O interface(s) 714 allows for input and output of data with other devices that may be connected to server 110. For example, I/O interface 714 may provide a connection to external devices 720 such as a keyboard, keypad, a touch screen, and/or some other suitable input device. External devices 720 can also include portable computer-readable storage media such as, for example, thumb drives, portable optical or magnetic disks, and memory cards. Software and data used to practice embodiments of the present invention, e.g., optimal yield program 112 in server 110, can be stored on such portable computer-readable storage media and can be loaded onto persistent storage 708 via I/O interface(s) 714. I/O interface(s) 714 can also connect to a display 722.

Display 722 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for determining an overall optimal yield point for a semiconductor wafer, wherein the semiconductor wafer comprises of a plurality of substantially identical semiconductor devices, each semiconductor device containing a plurality of component types, comprising the steps of:
   a computer determining a component optimal yield point for each component type, wherein the component optimal yield point represents one or more process parameter values where maximum yield is achieved for a component type;
   the computer determining a weight factor for each component type, wherein the weight factor represents an importance of a component type to the semiconductor wafer; and
   the computer determining an overall optimal yield point based on the component optimal yield point and weight factor determined for each component type, wherein the overall optimal yield point represents the one or more process parameter values where maximum yield is achieved for the semiconductor wafer, and wherein determining the overall optimal yield point comprises of: determining a center point between the determined component optimal yield points and determining an overall optimal yield point by adjusting the center point based on the determined weight factors.

2. The method of claim 1, wherein the step of determining a component optimal yield point for each component type comprises of:
   the computer determining yield points and non-yield points for each component type, wherein yield points represent the one or more process parameter values where the component type yields and non-yield points represent the one or more process parameter values where the component type does not yield;
   the computer creating a component plot for each component type, wherein the component plot comprises of the yield points and non-yield points for a component type;
   the computer determining a yield plot for each component type, wherein the yield plot comprises an area of a component plot where at least eighty percent of the points in the area are yield points; and
   the computer determining a component optimal yield point for each component type by determining the center point of the yield plot for each component type.

3. The method of claim 1, wherein the weight factor of a component type is at least partially based on the number of the component type present on each semiconductor device of the semiconductor wafer.

4. A computer program product for determining an overall optimal yield point for a semiconductor wafer, wherein the semiconductor wafer comprises of a plurality of substantially identical semiconductor devices, each semiconductor device containing a plurality of component types, the computer program product comprising:
   one or more computer-readable storage devices and program instructions stored on at least one of the one or more tangible storage devices, the program instructions comprising:
   program instructions to determine a component optimal yield point for each component type, wherein the component optimal yield point represents one or more process parameter values where maximum yield is achieved for a component type;
   program instructions to determine a weight factor for each component type, wherein the weight factor represents an importance of a component type to the semiconductor wafer; and
   program instructions to determine an overall optimal yield point based on the component yield point and weight factor determined for each component type, wherein the overall optimal yield point represents the one or more process parameter values where maximum yield is achieved for the semiconductor wafer, and wherein the program instructions to determine an overall optimal yield point further comprise: program instructions to determine a center point between the determined component optimal yield points and program instructions to determine an overall optimal yield point by adjusting the center point based on the determined weight factors.

5. The computer program product of claim 4, wherein the program instructions to determine a component optimal yield point for each component type comprises of:
   program instructions to determine yield points and non-yield points for each component type, wherein yield points represent the one or more process parameter values where the component type yields and non-yield points represent the one or more process parameter values where the component type does not yield;
   program instructions to create a component plot for each component type, wherein the component plot comprises of the yield points and non-yield points for a component type;
   program instructions to determine a yield plot for each component type, wherein the yield plot comprises an area of a component plot where at least eighty percent of the points in the area are yield points; and
   program instructions to determine a component optimal yield point for each component type by determining the center point of the yield plot for each component type.

6. The computer program product of claim 4, wherein the weight factor of a component type is at least partially based on the number of the component type present on each semiconductor device of the semiconductor wafer.

7. A computer system for determining an overall optimal yield point for a semiconductor wafer, wherein the semiconductor wafer comprises of a plurality of substantially identical semiconductor devices, each semiconductor device containing a plurality of component types, the computer system comprising:

one or more processors, one or more computer-readable memories, one or more computer-readable tangible storage devices, and program instructions stored on at least one of the one or more storage devices for execution by at least one of the one or more processors via at least one of the one or more memories, the program instructions comprising:

program instructions to determine a component optimal yield point for each component type, wherein the component optimal yield point represents one or more process parameter values where maximum yield is achieved for a component type;

program instructions to determine a weight factor for each component type, wherein the weight factor represents an importance of a component type to the semiconductor wafer; and program instructions to determine an overall optimal yield point based on the component yield point and weight factor determined for each component type, wherein the overall optimal yield point represents the one or more process parameter values where maximum yield is achieved for the semiconductor wafer, and wherein the program instructions to determine an overall optimal yield point further comprise: program instructions to determine a center point between the determined component optimal yield points and program instructions to determine an overall optimal yield point by adjusting the center point based on the determined weight factors.

8. The computer system of claim 7, wherein the program instructions to determine a component optimal yield point for each component type comprises of:

program instructions to determine yield points and non-yield points for each component type, wherein yield points represent the one or more process parameter values where the component type yields and non-yield points represent the one or more process parameter values where the component type does not yield;

program instructions to create a component plot for each component type, wherein the component plot comprises of the yield points and non-yield points for a component type;

program instructions to determine a yield plot for each component type, wherein the yield plot comprises an area of a component plot where at least eighty percent of the points in the area are yield points; and program instructions to determine a component optimal yield point for each component type by determining the center point of the yield plot for each component type.

9. The computer system of claim 7, wherein the weight factor of a component type is at least partially based on the number of the component type present on each semiconductor device of the semiconductor wafer.

* * * * *